(12) United States Patent
Ito et al.

(10) Patent No.: US 10,631,397 B1
(45) Date of Patent: Apr. 21, 2020

(54) PRINTED CIRCUIT BOARD, ELECTRONIC DEVICE AND HEAT CONDUCTION SHEET

(71) Applicants: SEIKO EPSON CORPORATION, Tokyo (JP); KITAGAWA INDUSTRIES CO., LTD., Inazawa-shi, Aichi (JP)

(72) Inventors: Masaaki Ito, Ina (JP); Toshiyuki Omori, Kamiina-gun (JP); Toru Matsuzaki, Kasugai (JP); Yasuhiro Kawaguchi, Kasugai (JP); Masahiro Saito, Kasugai (JP); Kensuke Mitsuya, Kasugai (JP)

(73) Assignees: SEIKO EPSON CORPORATION, Tokyo (JP); KITAGAWA INDUSTRIES CO., LTD., Inazawa-shi (JP)

( * ) Notice: Subject to any disclaimer, the term of this patent is extended or adjusted under 35 U.S.C. 154(b) by 0 days.

(21) Appl. No.: 16/658,334

(22) Filed: Oct. 21, 2019

(30) Foreign Application Priority Data

Oct. 25, 2018 (JP) ................................ 2018-201227

(51) Int. Cl.
*H05K 1/02* (2006.01)
(52) U.S. Cl.
CPC .................... *H05K 1/021* (2013.01)
(58) Field of Classification Search
CPC .. H05K 1/0201; H05K 1/0203; H05K 1/0207; H05K 1/0209
See application file for complete search history.

(56) References Cited

U.S. PATENT DOCUMENTS

| | | | |
|---|---|---|---|
| 6,426,457 | B1 | 7/2002 | Toyoda et al. |
| 7,608,326 | B2 | 10/2009 | Johnson |
| 7,625,633 | B2 | 12/2009 | Kawaguchi et al. |
| 9,868,889 | B2 | 1/2018 | Kawaguchi et al. |
| 2002/0029893 | A1 | 3/2002 | Toyoda et al. |
| 2006/0083948 | A1 | 4/2006 | Kawaguchi et al. |
| 2006/0099403 | A1 | 5/2006 | Johnson |
| 2016/0122610 | A1 | 5/2016 | Kawaguchi et al. |

FOREIGN PATENT DOCUMENTS

| | | |
|---|---|---|
| JP | H07-14950 A | 1/1995 |
| JP | H09-17921 A | 1/1997 |
| JP | H11-17083 A | 1/1999 |
| JP | H11-121976 A | 4/1999 |

(Continued)

*Primary Examiner* — Jeremy C Norris
(74) *Attorney, Agent, or Firm* — Oliff PLC

(57) ABSTRACT

A printed circuit board includes a printed wiring board having a mounting surface facing a first side, an electronic element provided on the mounting surface, a heat dissipation member disposed on the first side with respect to the electronic element, and a heat conduction member disposed between the electronic element and the heat dissipation member and having a first surface facing the first side and a second surface facing a second side opposite to the first side. The heat conduction member has a high relative magnetic permeability portion and a low relative dielectric constant portion. The high relative magnetic permeability portion surrounds the low relative dielectric constant portion on at least the second surface of the heat conduction member. At least part of the low relative dielectric constant portion overlaps the electronic element in a plan view seen in a direction perpendicular to the mounting surface.

18 Claims, 7 Drawing Sheets

(56) References Cited

FOREIGN PATENT DOCUMENTS

| | | |
|---|---|---|
| JP | H11-307974 A | 11/1999 |
| JP | 2001-068312 A | 3/2001 |
| JP | 2003-198173 A | 7/2003 |
| JP | 2005-101474 A | 4/2005 |
| JP | 2006-504272 A | 2/2006 |
| JP | 2016-092118 A | 5/2016 |
| JP | 2018-088510 A | 6/2018 |

PRINTED CIRCUIT BOARD, ELECTRONIC DEVICE AND HEAT CONDUCTION SHEET

CROSS-REFERENCE TO RELATED APPLICATION

This application claims priority from Japanese Patent Application No. 2018-201227 filed on Oct. 25, 2018, the contents of which are incorporated herein by reference.

BACKGROUND

1. Technical Field

The present invention relates to a printed circuit board, an electronic device, and a heat conduction sheet.

2. Related Art

For example, as shown in Patent Document 1, an electronic device unit in which a metal plate for heat dissipation is attached to an integrated circuit (IC) provided on a printed board is known.

[Patent Document 1] Japanese Unexamined Patent Application, First Publication No. H09-17921

[Patent Document 2] Japanese Unexamined Patent Application, First Publication No. H07-14950

[Patent Document 3] Japanese Unexamined Patent Application, First Publication No. H11-307974

In the electronic device unit (printed circuit board) as described above, for example, a heat conduction member such as a heat dissipation sheet as shown in Patent Document 2 may be disposed between the metal plate for heat dissipation (heat dissipation member) and the IC (electronic element). However, when such a heat conduction member is provided, there is a problem that undesired radiation noises (electromagnetic noises) emitted from the electronic device unit increase, with the IC serving as the source of the undesired radiation. With respect to the above problem, for example, as shown in Patent Document 3, it is conceivable to shield the undesired radiation noises by surrounding the entire IC with a shield case. However, in this case, there are problems that the number of components in the electronic device unit increases, a size of the electronic device unit is enlarged, or the like.

SUMMARY

One aspect of a printed circuit board of the invention includes a printed wiring board having a mounting surface facing a first side, an electronic element provided on the mounting surface, a heat dissipation member which is disposed on the first side with respect to the electronic element and is thermally connected to the electronic element, and a heat conduction member disposed between the electronic element and the heat dissipation member, the heat conduction member having a first surface facing the first side and a second surface facing a second side opposite to the first side and is characterized in that the heat conduction member has a high relative magnetic permeability portion including a magnetic body and a low relative dielectric constant portion having a relative dielectric constant smaller than a relative dielectric constant of the high relative magnetic permeability portion, the high relative magnetic permeability portion surrounds the low relative dielectric constant portion on at least the second surface of the heat conduction member, and at least part of the low relative dielectric constant portion overlaps the electronic element in a plan view seen in a predetermined direction perpendicular to the mounting surface.

A relative dielectric constant of the low relative dielectric constant portion may be equal to or less than 8.0.

One aspect of a printed circuit board of the invention includes a printed wiring board having a mounting surface facing a first side, an electronic element provided on the mounting surface, a heat dissipation member which is disposed on the first side with respect to the electronic element and is thermally connected to the electronic element, and a heat conduction member disposed between the electronic element and the heat dissipation member, the heat conduction member having a first surface facing the first side and a second surface facing a second side opposite to the first side and is characterized in that the heat conduction member has a high relative magnetic permeability portion including a magnetic body and a low relative dielectric constant portion having a relative dielectric constant equal to or less than 8.0, the high relative magnetic permeability portion surrounds the low relative dielectric constant portion on at least the second surface of the heat conduction member, and at least part of the low relative dielectric constant portion overlaps the electronic element in a plan view seen in a predetermined direction perpendicular to the mounting surface.

The high relative magnetic permeability portion may have a frame shape surrounding the low relative dielectric constant portion, and may be configured to surround the low relative dielectric constant portion on both the first surface of the heat conduction member and the second surface of the heat conduction member.

The high relative magnetic permeability portion may be configured to have a portion positioned between the low relative dielectric constant portion and the heat dissipation member in the predetermined direction.

In the plan view seen in the predetermined direction, the heat conduction member may be larger than the electronic element and overlap the entire electronic element.

In the plan view seen in the predetermined direction, a region where the low relative dielectric constant portion is provided on the second surface of the heat conduction member may be configured to be larger than the electronic element and overlap the entire electronic element.

The heat conduction member may have a sheet shape.

One aspect of an electronic device of the invention is characterized by including the printed circuit board mentioned above.

One aspect of a heat conduction sheet of the invention is a heat conduction sheet having a first surface and a second surface opposite to the first surface, which includes a high relative magnetic permeability portion including a magnetic body and a low relative dielectric constant portion having a relative dielectric constant smaller than a relative dielectric constant of the high relative magnetic permeability portion, and which is characterized in that the high relative magnetic permeability portion surrounds the low relative dielectric constant portion on at least the second surface of the heat conduction sheet.

One aspect of a heat conduction sheet of the invention is a heat conduction sheet having a first surface and a second surface opposite to the first surface, which includes a high relative magnetic permeability portion including a magnetic body and a low relative dielectric constant portion having a relative dielectric constant equal to or less than 8.0, and which is characterized in that the high relative magnetic permeability portion surrounds the low relative dielectric constant portion on at least the second surface of the heat conduction sheet.

DESCRIPTION OF EXEMPLARY EMBODIMENTS

Hereinafter, a printed circuit board according to an embodiment of the invention and an electronic device including the printed circuit board will be described with reference to the drawings. In the following embodiments, a projector is described as an example of the electronic device.

Also, the scope of the invention is not limited to the following embodiments and can be arbitrarily changed within the scope of the technical idea of the invention. In addition, in the following drawings, in order to make each structure intelligible, the scale, the number, or the like in each structure may be different from those in an actual structure.

First Embodiment

Figure 1:
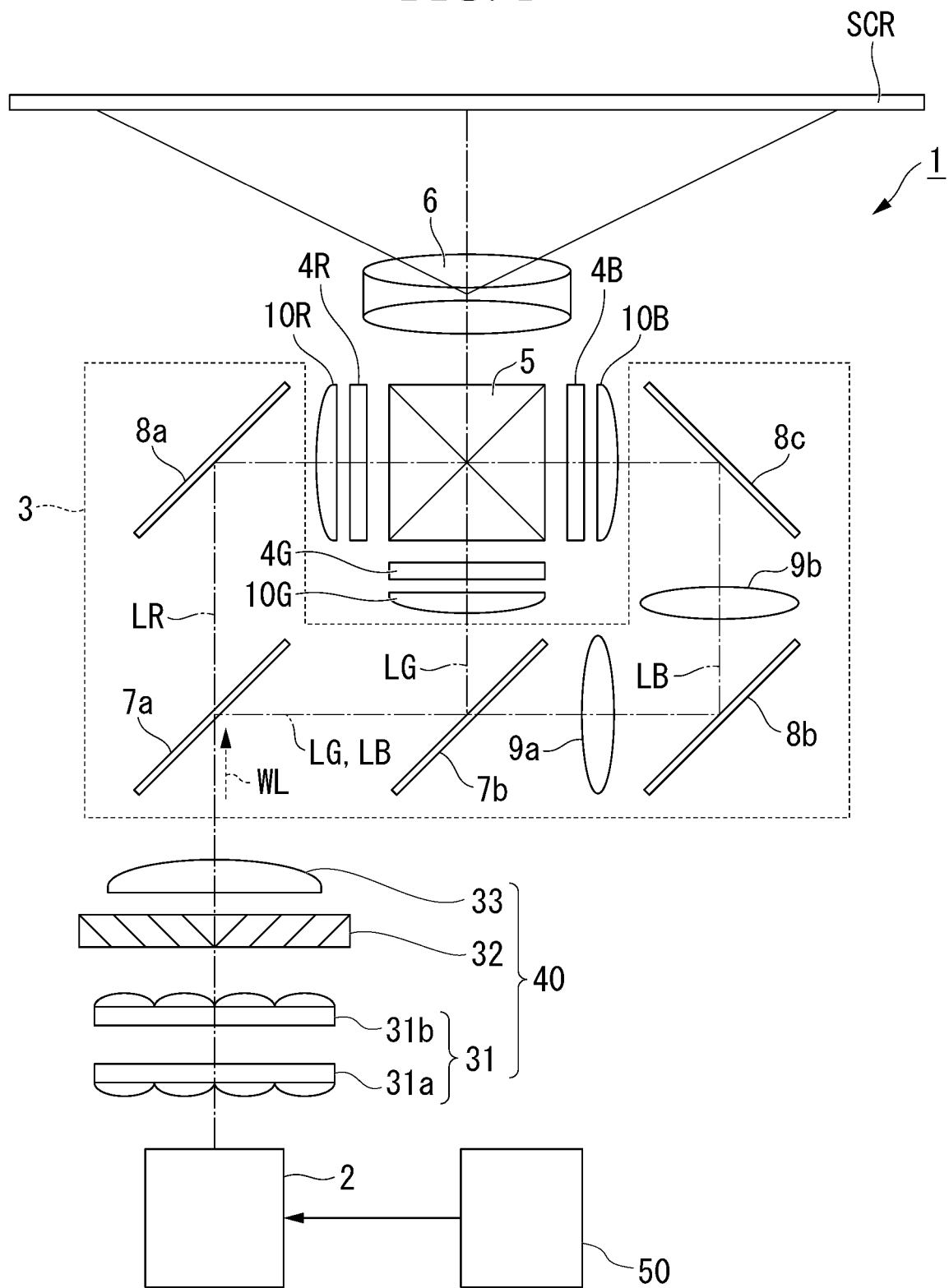
FIG. 1 is a schematic configurational view showing a projector of a first embodiment.

FIG. 1 is a schematic configurational view showing a projector (an electronic device) 1 of the present embodiment.

The projector 1 of the present embodiment is a projection type image display device that projects a color image on a screen SCR. As shown in FIG. 1, the projector 1 includes a light source device 2, a uniform illumination optical system 40, a color separation optical system 3, a light modulation device 4R, a light modulation device 4G, a light modulation device 4B, an optical mixing system 5, a projection optical device 6, and a control device 50. The light source device 2 emits illumination light WL toward the uniform illumination optical system 40.

The uniform illumination optical system 40 includes an integrator optical system 31, a polarization conversion element 32, and a superposition optical system 33. The integrator optical system 31 includes a first lens array 31a and a second lens array 31b. The uniform illumination optical system 40 equalizes an intensity distribution of the illumination light WL emitted from the light source device 2 in each of the light modulation device 4R, the light modulation device 4G, and the light modulation device 4B, which are regions to be illuminated. The illumination light WL emitted from the uniform illumination optical system 40 enters the color separation optical system 3.

The color separation optical system 3 separates the white illumination light WL into red light LR, green light LG and blue light LB. The color separation optical system 3 includes a first dichroic mirror 7a, a second dichroic mirror 7b, a first reflection mirror 8a, a second reflection mirror 8b, a third reflection mirror 8c, a first relay lens 9a, and a second relay lens 9b.

The first dichroic mirror 7a separates the illumination light WL from the light source device 2 into red light LR and other light (green light LG and blue light LB). The first dichroic mirror 7a transmits the separated red light LR and reflects other light (green light LG and blue light LB). On the other hand, the second dichroic mirror 7b separates other light into green light LG and blue light LB. The second dichroic mirror 7b reflects the separated green light LG and transmits the blue light LB.

The first reflection mirror 8a is disposed in an optical path of the red light LR and reflects the red light LR transmitted through the first dichroic mirror 7a toward the light modulation device 4R. On the other hand, the second reflection mirror 8b and the third reflection mirror 8c are disposed in an optical path of the blue light LB and reflect the blue light LB transmitted through the second dichroic mirror 7b toward the light modulation device 4B. Also, the green light LG is reflected by the second dichroic mirror 7b toward the light modulation device 4G.

The first relay lens 9a and the second relay lens 9b are disposed on a light emitting side of the second dichroic mirror 7b in the optical path of the blue light LB. The first relay lens 9a and the second relay lens 9b correct a difference in illumination distribution of the blue light LB resulting from the fact that an optical path length of the blue light LB is longer than an optical path length of the red light LR and an optical path length of the green light LG.

The light modulation device 4R modulates the red light LR in accordance with the image information to form image light corresponding to the red light LR. The light modulation device 4G modulates the green light LG in accordance with the image information to form image light corresponding to the green light LG. The light modulation device 4B modulates the blue light LB in accordance with the image information to form image light corresponding to the blue light LB.

For example, a transmissive type liquid crystal panel is used for the light modulation device 4R, the light modulation device 4G, and the light modulation device 4B. In addition, polarizing plates (not shown) are disposed on each of a light incident side and a light emitting side of the liquid crystal panel and are configured to transmit only light that is linearly polarized in a specific direction.

A field lens 10R, a field lens 10G, and a field lens 10B are disposed respectively on light incident sides of the light modulation device 4R, the light modulation device 4G, and the light modulation device 4B. The field lens 10R, the field lens 10G, and the field lens 10B collimate main light beams of red light LR, green light LG, and blue light LB which are incident respectively on the light modulation device 4R, the light modulation device 4G, and the light modulation device 4B.

As the image light emitted from the light modulation device 4R, the light modulation device 4G, and the light modulation device 4B is incident on the optical mixing system 5, the optical mixing system 5 mixes the image light corresponding to the red light LR, the green light LG, and the blue light LB, and emits the mixed image light toward the projection optical device 6. For example, a cross dichroic prism is used for the optical mixing system 5.

The projection optical device 6 is configured of a plurality of projection lenses. The projection optical device 6 enlarges and projects the image light mixed by the optical mixing system 5 toward the screen SCR. Thus, an image is displayed on the screen SCR.

Next, the control device 50 will be described.

In the following description, relative positional relationships and the like between respective portions will be described, assuming that a Z-axis direction shown in appropriate figures is a vertical direction (a predetermined direction). A positive side (+Z side) in the Z-axis direction is referred to as an upper side (a first side), and a negative side (−Z side) in the Z-axis direction is referred to as a lower side (a second side). Also, a direction orthogonal to the vertical direction is referred to as a horizontal direction.

In addition, the vertical direction, the horizontal direction, the upper side and the lower side are names only for describing the relative positional relationships and the like between the respective portions, and actual dispositional relationships and the like may be different from dispositional relationships and the like indicated by these names.

Figure 2:
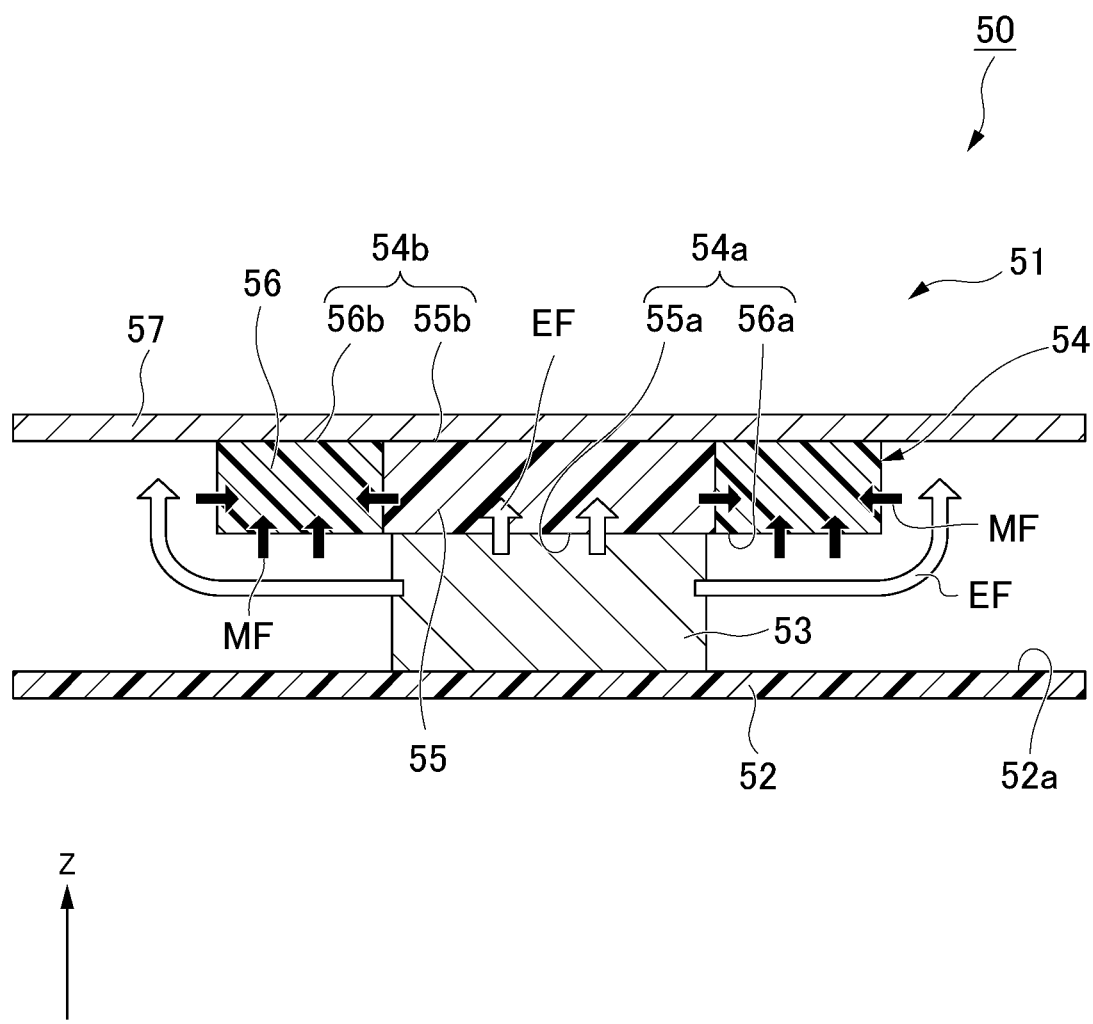
FIG. 2 is a cross-sectional view showing a printed circuit board of the first embodiment.
Figure 3:
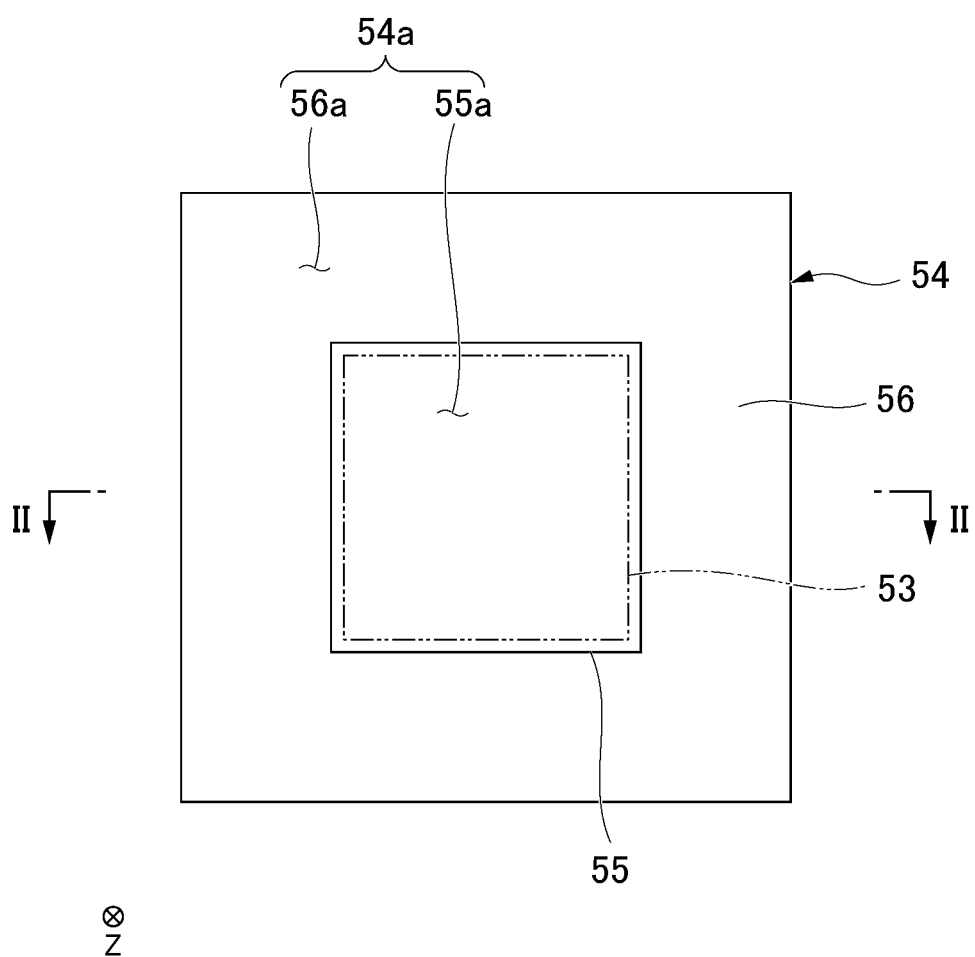
FIG. 3 is a plan view showing a heat conduction member of the first embodiment from below.

FIG. 2 is a cross-sectional view showing a printed circuit board 51 in the control device 50. FIG. 3 is a plan view of a heat conduction member 54 in the control device 50 from below. In addition, the cross-sectional view of the heat conduction member 54 in FIG. 2 is a cross-sectional view taken along line II-II in FIG. 3.

The control device 50 is a main board that controls each portion of the projector 1 including the light source device 2. As shown in FIG. 2, the control device 50 includes the printed circuit board 51. The printed circuit board 51 includes a printed wiring board 52, an electronic element 53, a heat dissipation member 57, and a heat conduction member (heat conduction sheet) 54.

The printed wiring board 52 has a plate shape of which plate surfaces are directed in the vertical direction. Although not shown in the drawings, the printed wiring board 52 has a configuration in which a wiring pattern made of copper foil is provided on at least one surface of a substrate made of a material such as a paper phenol laminate or a glass epoxy board laminate. Any one of a single-sided printed wiring board, a double-sided printed wiring board, and a multilayer printed wiring board may be used for the printed wiring board 52. Also, for the printed wiring board 52, a rigid printed wiring board without flexibility may be used, or a flexible printed wiring board with flexibility may be used. In the present embodiment, the printed wiring board 52 has a mounting surface 52a provided with the wiring pattern. The mounting surface 52a is a surface of the printed wiring board 52 facing upward between the plate surfaces. In the present embodiment, the mounting surface 52a is orthogonal to the vertical direction. That is, the vertical direction is the predetermined direction perpendicular to the mounting surface 52a.

The electronic element 53 is provided on the mounting surface 52a of the printed wiring board 52. The electronic element 53 is, for example, an integrated circuit (IC) such as a large scale integration (LSI). Although not shown in the drawings, the electronic element 53 includes a semiconductor chip made of silicon, a package covering the semiconductor chip, and a plurality of terminals provided on a lower surface of the package. The electronic element 53 is electrically connected to the wiring pattern provided on the mounting surface 52a of the printed wiring board 52 via the plurality of terminals. Also, the electronic element 53 is a heat source and a source of undesired radiation, which will be described in detail later. In the present embodiment, the electronic element 53 has, for example, a substantially rectangular parallelepiped shape. As shown in FIG. 3, the electronic element 53 has, for example, a square shape in a plan view seen in the vertical direction.

The heat dissipation member 57 is disposed above the electronic element 53 as shown in FIG. 2. The heat dissipation member 57 is attached to the electronic element 53 via the heat conduction member 54. In the present embodiment, the heat dissipation member 57 has a plate shape of which plate surfaces are directed in the vertical direction. The plate surfaces of the heat dissipation member 57 are, for example, orthogonal to the vertical direction. In a plan view seen in the vertical direction, the heat dissipation member 57 is larger than the electronic element 53 and the heat conduction member 54, and overlaps the entire electronic element 53 and the entire heat conduction member 54.

The heat dissipation member 57 is configured of, for example, a flat plate made of a metal having a relatively high thermal conductivity, such as aluminum or copper. The heat dissipation member 57 is thermally connected to the electronic element 53.

Also, in the present specification, "some objects are thermally connected" may mean a state in which some objects are directly or indirectly connected to each other and heat is transferred between the objects. In the present embodiment, the heat dissipation member 57 is indirectly connected to the electronic element 53 via the heat conduction member 54, and the heat of the electronic element 53 is transferred to the heat dissipation member 57 via the heat conduction member 54.

The heat conduction member 54 is a member that transfers heat from the electronic element 53 to the heat dissipation member 57. The heat conduction member 54 is a dielectric. The heat conduction member 54 is disposed between the electronic element 53 and the heat dissipation member 57 in the vertical direction. In the present embodiment, the heat conduction member 54 has a sheet shape extending in the horizontal direction orthogonal to the vertical direction. That is, in the present embodiment, the heat conduction member 54 is a heat conduction sheet. As sheet surfaces, the heat conduction member 54 has an upper surface (a first surface) 54b which faces upward, and a lower surface (a second surface) 54a which is a surface opposite to the upper surface 54b and faces downward. In the present embodiment, the lower surface 54a of the heat conduction member 54 and the upper surface 54b of the heat conduction member 54 are perpendicular to the vertical direction.

The lower surface 54a of the heat conduction member 54 is bonded to an upper surface of the electronic element 53. The upper surface 54b of the heat conduction member 54 is bonded to a lower surface of the heat dissipation member 57. A method for bonding the heat conduction member 54 and the electronic element 53 and a method for bonding the heat conduction member 54 and the heat dissipation member 57 are not particularly limited. The heat conduction member 54 and the electronic element 53 are bonded, for example, by an adhesive or the like. Similarly, the heat conduction member 54 and the heat dissipation member 57 are bonded, for example, by an adhesive or the like. Also, a base material of the heat conduction member 54 may be a substance having adhesiveness, and the heat conduction member 54 and the electronic element 53 may be directly bonded together without an adhesive or the like. Also, similarly, the heat conduction member 54 and the heat dissipation member 57 may be directly bonded without an adhesive or the like.

In a plan view seen in the vertical direction, the heat conduction member 54 is larger than the electronic element 53 and overlaps the entire electronic element 53. The heat conduction member 54 has a low relative dielectric constant portion (a second portion) 55 and a high relative magnetic permeability portion (a first portion) 56.

The low relative dielectric constant portion 55 is a portion where a relative dielectric constant ε is relatively small. The relative dielectric constant ε of the low relative dielectric constant portion 55 is smaller than the relative dielectric constant ε of the high relative magnetic permeability portion 56. The relative dielectric constant ε of the low relative dielectric constant portion 55 is 8.0 or less. The relative dielectric constant ε of the low relative dielectric constant portion 55 is preferably, for example, about 4.0 or less. This is so that undesired radiation noises emitted from the printed circuit board 51 can be further reduced. The low relative dielectric constant portion 55 is made of, for example, a silicone resin, an acrylic resin, or the like. The low relative dielectric constant portion 55 does not contain a magnetic body and is a nonmagnetic portion. A relative magnetic permeability μ of the nonmagnetic low relative dielectric constant portion 55 is approximately 1.0.

In addition, the relative dielectric constant ε in the present specification is a value at a frequency of 1 GHz measured by using E4991A RF Impedance/Material Analyzer manufactured by Keysight Technologies under conditions of a temperature of 25° C. and a relative humidity of 30%. Also, the relative magnetic permeability μ in the present specification is a value at a frequency of 1 GHz measured by using E4991A RF Impedance/Material Analyzer manufactured by Keysight Technologies under conditions of a temperature of 25° C. and a relative humidity of 30%.

A thermal conductivity of the low relative dielectric constant portion 55 is large enough to appropriately transfer heat from the electronic element 53 to the heat dissipation member 57, and is, for example, about 0.5 or more and 20.0 or less. The thermal conductivity of the low relative dielectric constant portion 55 is, for example, larger than a thermal conductivity of the high relative magnetic permeability portion 56. In the present embodiment, the heat of the electronic element 53 is transferred to the heat dissipation member 57 via the low relative dielectric constant portion 55.

The low relative dielectric constant portion 55 is a central portion of the heat conduction member 54. In the present embodiment, the low relative dielectric constant portion 55 is formed such that its surfaces on both sides in the vertical direction are exposed to the outside of the heat conduction member 54 when the heat conduction member 54 is viewed alone. A lower surface 55a of the low relative dielectric constant portion 55 constitutes a portion of the lower surface 54a of the heat conduction member 54. An upper surface 55b of the low relative dielectric constant portion 55 constitutes a portion of the upper surface 54b of the heat conduction member 54. The low relative dielectric constant portion 55 has, for example, a square shape in a plan view seen in the vertical direction, as shown in FIG. 3.

In a plan view seen in the vertical direction, the low relative dielectric constant portion 55 is larger than the electronic element 53 and overlaps the entire electronic element 53. In the present embodiment, the lower surface 55a and the upper surface 55b of the low relative dielectric constant portion 55 are both larger than the electronic element 53 and overlap the entire electronic element 53 in a plan view seen in the vertical direction. That is, a region provided with the low relative dielectric constant portion 55 in the lower surface 54a of the heat conduction member 54 and a region provided with the low relative dielectric constant portion 55 in the upper surface 54b of the heat conduction member 54 are larger than the electronic element 53 and overlap the entire electronic element 53 in a plan view seen in the vertical direction. As shown in FIG. 3, an outer edge of the low relative dielectric constant portion 55 is disposed at a position spaced outward from an outer edge of the electronic element 53 and surrounds the outer edge of the electronic element 53 in a plan view seen in the vertical direction. As shown in FIG. 2, the lower surface 55a of the low relative dielectric constant portion 55 is bonded to the upper surface of the electronic element 53. The upper surface 55b of the low relative dielectric constant portion 55 is bonded to the lower surface of the heat dissipation member 57.

The high relative magnetic permeability portion 56 is a portion including magnetic bodies. The relative magnetic permeability μ of the high relative magnetic permeability portion 56 is larger than 1.0. The relative magnetic permeability μ of the high relative magnetic permeability portion 56 is, for example, about 3.0 or more and 15.0 or less. Although not shown in the drawings, the high relative magnetic permeability portion 56 has a configuration in which a plurality of magnetic bodies are included in a base material. For the base material, for example, a silicone resin, an acrylic resin, etc. may be used. Each of the plurality of magnetic bodies is, for example, a small piece having a needle shape, a rod shape, a plate shape or another shape, and has a longer side direction. For the magnetic bodies, for example, a soft magnetic material such as a ferrite containing an iron oxide as a main component may be used. The relative magnetic permeability μ of the high relative magnetic permeability portion 56 increases as an amount of the magnetic bodies contained in the base material increases. The relative dielectric constant ε of the high relative magnetic permeability portion 56 is larger than the relative dielectric constant ε of the low relative dielectric constant portion 55. A thermal conductivity of the high relative magnetic permeability portion 56 is not particularly limited.

In the present embodiment, the high relative magnetic permeability portion 56 has a frame shape surrounding the low relative dielectric constant portion 55, as shown in FIGS. 2 and 3, and surrounds the low relative dielectric constant portion 55 over a whole circumference thereof in the surfaces on both sides in the vertical direction (the lower surface 54a and the upper surface 54b) among a plurality of surfaces of the heat conduction member 54. The high relative magnetic permeability portion 56 has, for example, a square frame shape. The high relative magnetic permeability portion 56 of the present embodiment is disposed outside the electronic element 53 in a plan view seen in the vertical direction. The low relative dielectric constant portion 55 is fitted inside the high relative magnetic permeability portion 56. An inner edge of the high relative magnetic permeability portion 56 is disposed in contact with the outer edge of the low relative dielectric constant portion 55. The low relative dielectric constant portion 55 and the high relative magnetic permeability portion 56 may be joined by using, for example, an adhesive or the like. In the present embodiment, a dimension of the high relative magnetic permeability portion 56 in the vertical direction is, for example, the same as a dimension of the low relative dielectric constant portion 55 in the vertical direction.

As shown in FIG. 2, a lower surface 56a of the high relative magnetic permeability portion 56 constitutes a portion of the lower surface 54a of the heat conduction member 54. A lower surface 56a of the high relative magnetic permeability portion 56 is smoothly connected to the lower surface 55a of the low relative dielectric constant portion 55. In the present embodiment, the lower surface 54a of the heat conduction member 54 is configured of the lower surface 55a of the low relative dielectric constant portion 55 and the lower surface 56a of the high relative magnetic permeability portion 56. The lower surface 56a of the high relative magnetic permeability portion 56 is positioned above the mounting surface 52a of the printed wiring board 52, and is disposed to be opposite to the mounting surface 52a with a gap.

An upper surface 56b of the high relative magnetic permeability portion 56 constitutes a portion of the upper surface 54b of the heat conduction member 54. The upper surface 56b of the high relative magnetic permeability portion 56 is smoothly connected to the upper surface 55b of the low relative dielectric constant portion 55. In the present embodiment, the upper surface 54b of the heat conduction member 54 is configured of the upper surface 55b of the low relative dielectric constant portion 55 and the upper surface 56b of the high relative magnetic permeability portion 56. The upper surface 56b of the high relative magnetic permeability portion 56 is bonded to the lower surface of the heat dissipation member 57.

Hereinafter, operations and effects of the printed circuit board 51 of the present embodiment will be described.

Figure 9:
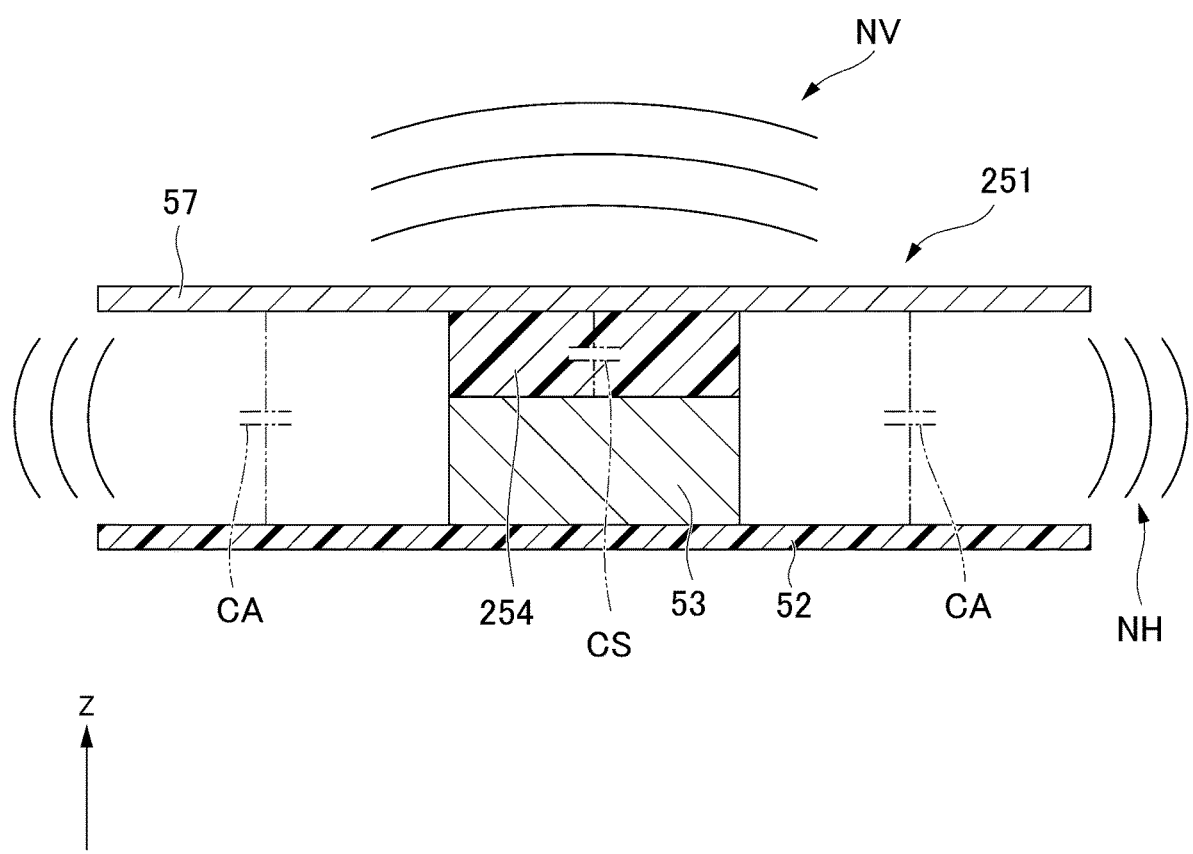
FIG. 9 is a cross-sectional view showing a printed circuit board of a comparative example.

FIG. 9 is a cross-sectional view showing a printed circuit board 251 of a comparative example.

As shown in FIG. 9, the printed circuit board 251 of the comparative example is different from the printed circuit board 51 of the above-described embodiment in that a heat conduction member 254 is provided instead of the heat conduction member 54. The heat conduction member 254 has the same properties throughout the member. A relative dielectric constant ε of the heat conduction member 254 is larger than 8.0. The relative dielectric constant ε of the heat conduction member 254 is, for example, 10.0 or more. A thermal conductivity of the heat conduction member 254 is, for example, substantially the same as the thermal conductivity of the low relative dielectric constant portion 55. The heat conduction member 254 is a nonmagnetic member that does not contain a magnetic body. In a plan view seen in the vertical direction, the heat conduction member 254 has the same shape and size as the electronic element 53 and the entire heat conduction member 254 overlaps the electronic element 53.

The printed circuit board 251 emits undesired radiation noises (electromagnetic noises) from the electronic element 53 serving as the source of the undesired radiation. The undesired radiation noises are electromagnetic waves. The undesired radiation noises emitted from the printed circuit board 251 are increased because the heat conduction member 254 is provided. The principle is as follows.

Since the heat conduction member 254 is a dielectric, dielectric polarization occurs in the heat conduction member 254 due to an electric field of undesired radiation noises emitted from the electronic element 53. When the dielectric polarization occurs, the heat conduction member 254 functions as a capacitor CS as virtually shown in FIG. 9, and a voltage is induced between the electronic element 53 and the heat dissipation member 57. Such a phenomenon is called electrostatic coupling. The electrostatic coupling causes a displacement current to flow between the electronic element 53 and the heat dissipation member 57. Also, in the following description, generation of electrostatic coupling due to undesired radiation noises is referred to as "coupling of undesired radiation noises."

By coupling the undesired radiation noises emitted from the electronic element 53 to the heat dissipation member 57, the heat dissipation member 57 resonates and functions as an antenna that amplifies and emits the undesired radiation noises. By the heat conduction member 254 being provided according to the principle as described above, undesired radiation noises emitted from the printed circuit board 251 increase. The undesired radiation noises emitted from the heat dissipation member 57 functioning as an antenna are undesired radiation noises NV emitted upward from the heat dissipation member 57.

Here, as the relative dielectric constant ε of the heat conduction member 254 becomes larger, an electrostatic capacitance of the virtual capacitor CS increases, and the voltage induced by the electrostatic coupling increases. That is, the undesired radiation noises emitted from the electronic element 53 are easily coupled to the heat dissipation member 57. As a result, the displacement current flowing between the electronic element 53 and the heat dissipation member 57 increases, and the undesired radiation noises NV emitted from the heat dissipation member 57 further increase. Therefore, as the relative dielectric constant ε of the heat conduction member 254 becomes larger, the undesired radiation noises emitted from the printed circuit board 251 increase.

In addition, although the phenomenon itself in which the undesired radiation noises emitted from the printed circuit board 251 increase when the heat conduction member 254 is provided is known conventionally, the inventors newly found the principle described above.

The undesired radiation noises emitted from the printed circuit board 251 also include undesired radiation noises other than the undesired radiation noises NV emitted from the heat dissipation member 57 described above. Specifically, the undesired radiation noises emitted from the printed circuit board 251 include undesired radiation noises NH emitted in the horizontal direction orthogonal to the vertical direction from between the printed wiring board 52 and the heat dissipation member 57. The principle on which the undesired radiation noises NH are emitted is as follows.

Since air between the printed wiring board 52 and the heat dissipation member 57 is also a dielectric, it is dielectrically polarized by an electric field of undesired radiation noises from the electronic element 53, and functions as a capacitor CA virtually shown in FIG. 9. In addition, an electrostatic capacitance of the capacitor CA is smaller than the electrostatic capacitance of the capacitor CS. A circuit configured of the air capacitor CA, the capacitor CS of the heat conduction member 254, the printed wiring board 52, the electronic element 53, and the heat dissipation member 57 generates a displacement current flowing between the heat dissipation member 57 and the printed wiring board 52. Due to this displacement current, dielectric resonance occurs, and undesired radiation noises NH are emitted in the horizontal direction from between the printed wiring board 52 and the heat dissipation member 57.

As described above, the undesired radiation noises emitted from the printed circuit board 251 include the undesired radiation noises NV emitted upward and the undesired radiation noises NH emitted in the horizontal direction.

According to the present embodiment, the heat conduction member 54 has the low relative dielectric constant portion 55 whose relative dielectric constant ε is smaller than that of the high relative magnetic permeability portion 56. For this reason, the relative dielectric constant ε of the low relative dielectric constant portion 55 can be easily made relatively small, and when the low relative dielectric constant portion 55 functions as the capacitor CS, the capacitance of the capacitor CS can be made small. As a result, undesired radiation noises emitted from the electronic element 53 are less likely to be coupled to the heat dissipation member 57 via the heat conduction member 54. Therefore, the undesired radiation noises emitted from the electronic element 53 can be inhibited from being amplified by the heat dissipation member 57, and the undesired radiation noises NV emitted from the heat dissipation member 57 can be reduced. As a result, the total undesired radiation noises emitted from the printed circuit board 51 can be reduced.

Here, as described above, it is a finding newly obtained by the present inventors that the relative dielectric constant ε of the heat conduction member 54 is related to an increase of the undesired radiation noises. The printed circuit board 51 of the present embodiment is a printed circuit board that can realize reduction of the undesired radiation noises to be emitted based on this new finding.

Further, according to the present embodiment, the heat conduction member 54 has the high relative magnetic permeability portion 56 including the magnetic bodies. By including the magnetic bodies, the relative magnetic permeability μ of the high relative magnetic permeability portion 56 becomes larger than 1.0. Magnetic flux easily passes through a member having the relative magnetic permeability μ of more than 1.0, so that a magnetic field is easily generated inside. For this reason, the magnetic field of the undesired radiation noises emitted from the electronic element 53 is attracted, and the undesired radiation noises easily pass through the high relative magnetic permeability portion 56. When the undesired radiation noises pass through the high relative magnetic permeability portion 56, magnetic flux and current are generated in the high relative magnetic permeability portion 56 to become heat, resulting in a magnetic loss. As a result, the energy of the undesired radiation noises emitted from the electronic element 53 is reduced, and the undesired radiation noises emitted from the printed circuit board 51 can be further reduced. As described above, the energy of the undesired radiation noises emitted from the electronic element 53 can be reduced, so that the undesired radiation noises NH emitted in the horizontal direction from the printed circuit board 51 can also be reduced.

As described above, according to the present embodiment, by providing the low relative dielectric constant portion 55 and the high relative magnetic permeability portion 56, the undesired radiation noises emitted from the printed circuit board 51 due to the heat conduction member 54 are appropriately reduced. For this reason, even when heat dissipating properties of the electronic element 53 are improved by providing the heat dissipation member 57 and the heat conduction member 54, the undesired radiation noises emitted from the printed circuit board 51 can be inhibited without providing a shielding member such as a shield case. Thus, an increase in size of the printed circuit board 51 can be inhibited while the undesired radiation noises can be inhibited. Therefore, it is possible to inhibit enlargement of the projector 1 while improving reliability of the projector 1 on which the printed circuit board 51 is mounted.

Moreover, since it is not necessary to additionally provide a shielding member such as a shield case, it is possible to inhibit an increase in the number of components of the printed circuit board 51. Thus, the number of steps and cost for assembling the printed circuit board 51 can be reduced. Therefore, the manufacturing cost of the projector 1 can be reduced. Further, it is possible to inhibit deterioration of the heat dissipating properties of the electronic element 53 resulting from the shielding member such as the shield case.

Also, in particular, the low relative dielectric constant portion 55 easily inhibits the coupling between the undesired radiation noises having a relatively low frequency and the heat dissipation member 57. On the other hand, the low relative dielectric constant portion 55 more easily causes the coupling with heat dissipation member 57 with respect to undesired radiation noises having a relatively high frequency as compared with undesired radiation noises having a relatively low frequency. That is, the low relative dielectric constant portion 55 is less likely to reduce the undesired radiation noises having a relatively high frequency as compared with the undesired radiation noises having a relatively low frequency.

On the other hand, the high relative magnetic permeability portion 56 easily causes a loss of the energy of the undesired radiation noises having a high frequency, in particular. For this reason, the undesired radiation noises having a relatively high frequency can be particularly reduced. Therefore, by combining the low relative dielectric constant portion 55 and the high relative magnetic permeability portion 56, both of the undesired radiation noises having a relatively low frequency and the undesired radiation noises having a relatively high frequency can be reduced.

Here, in a video device such as the projector 1 of the present embodiment, both of the undesired radiation noises having a relatively low frequency and the undesired radiation noises having a relatively high frequency are easily emitted from the printed circuit board 51. For this reason, the effect capable of reducing both of the undesired radiation noises having a relatively low frequency and the undesired radiation noises having a relatively high frequency can be obtained more usefully when the printed circuit board 51 is mounted in a video device.

In addition, the relatively low frequency is, for example, a frequency smaller than 1 GHz. The relatively high frequency is, for example, a frequency of 1 GHz or more.

In FIG. 2, the inhibition effect of the undesired radiation noises mentioned above is visually shown using arrows. White arrows EF indicate a behavior of the undesired radiation noises as an electric field. Black arrows MF indicate a behavior of the undesired radiation noises as a magnetic field. Also, the arrows EF and MF are shown virtually for the purpose of visually explaining the inhibition effect of the undesired radiation noises.

As indicated by the arrows EF in FIG. 2, the low relative dielectric constant portion 55 inhibits the undesired radiation noises from the electronic element 53 from being coupled to the heat dissipation member 57. In addition, although FIG. 2 shows, for the purpose of clearly showing the inhibition effect of the undesired radiation noises, that the undesired radiation noises emitted from the electronic element 53 to the heat dissipation member 57 side (upper side) are blocked by the low relative dielectric constant portion 55, in fact, the undesired radiation noises themselves which are emitted from the electronic element 53 to the heat dissipation member 57 side (upper side) are reduced because of the presence of the low relative dielectric constant portion 55.

Further, the undesired radiation noises emitted from the electronic element 53 in the horizontal direction show a behavior of avoiding the high relative magnetic permeability portion 56 as an electric field, as indicated by the arrows EF, but show a behavior of being attracted to the high relative magnetic permeability portion 56 as a magnetic field, as indicated by the arrows MF. As a result, the undesired radiation noises emitted from the electronic element 53 in the horizontal direction are attracted to the high relative magnetic permeability portion 56 and show a behavior of passing through the high relative magnetic permeability portion 56. Thus, a magnetic loss occurs in the high relative magnetic permeability portion 56.

According to the present embodiment, the low relative dielectric constant portion 55 at least partially overlaps the electronic element 53 in a plan view seen in the vertical direction. For this reason, the low relative dielectric constant portion 55 is position immediately above at least a portion of the electronic element 53, and the low relative dielectric constant portion 55 is connected to the electronic element 53. Here, the undesired radiation noises coupled from the electronic element 53 to the heat dissipation member 57 has many undesired radiation noises coupled to the heat dissipation member 57 through a connection portion between the electronic element 53 and the heat conduction member 54. For this reason, by configuring at least some of the portion connected to the electronic element 53 in the heat conduction member 54 as the low relative dielectric constant portion 55, the low relative dielectric constant portion 55 can more appropriately inhibit the undesired radiation noises from being coupled to the heat dissipation member 57, so that the undesired radiation noises emitted from the printed circuit board 51 can be more appropriately reduced.

Also, according to the present embodiment, the high relative magnetic permeability portion 56 surrounds the low relative dielectric constant portion 55 over a whole circumference thereof at least on the lower surface 54a of the heat conduction member 54. For this reason, as shown by the arrows MF in FIG. 2, the undesired radiation noises emitted from the entire circumference of side surfaces of the electronic element 53 in the horizontal direction can be attracted toward the high relative magnetic permeability portion 56, thereby appropriately passing through the high relative magnetic permeability portion 56. In addition, since the magnetic flux and the current can flow to rotate around the low relative dielectric constant portion 55 in the high relative magnetic permeability portion 56, a path through which the magnetic flux and the current flow can be made longer. Thus, the magnetic loss can be appropriately generated to appropriately reduce the energy of the undesired radiation noises, and the undesired radiation noises emitted from the printed circuit board 51 can be more appropriately reduced.

Also, the undesired radiation noises that tends to pass through the low relative dielectric constant portion 55 in the vertical direction can be attracted to the high relative magnetic permeability portion 56 around the low relative dielectric constant portion 55. Thus, the energy of the undesired radiation noises can be more appropriately reduced, and the undesired radiation noises emitted from the printed circuit board 51 can be more appropriately reduced.

Also, according to the present embodiment, the relative dielectric constant of the low relative dielectric constant portion 55 is 8.0 or less. For this reason, the relative dielectric constant ε of the low relative dielectric constant portion 55 can be appropriately reduced. Thus, the undesired radiation noises can be more appropriately inhibited from being coupled to the heat dissipation member 57. Therefore, the undesired radiation noises emitted from the printed circuit board 51 can be reduced more appropriately.

Also, according to the present embodiment, the high relative magnetic permeability portion 56 has a frame shape surrounding the low relative dielectric constant portion 55, and surrounds the low relative dielectric constant portion 55 over a whole circumference thereof on the upper surface 54b and the lower surface 54a of the heat conduction member 54. For this reason, the heat conduction member 54 can be manufactured by fitting the low relative dielectric constant portion 55 to the inside of the high relative magnetic permeability portion 56 after separately manufacturing the low relative dielectric constant portion 55 and the frame-shaped high relative magnetic permeability portion 56 with the same thickness. Therefore, the heat conduction member 54 can be easily manufactured.

Also, according to the present embodiment, the heat conduction member 54 is larger than the electronic element 53 and overlaps the entire electronic element 53 in a plan view seen in the vertical direction. For this reason, most of the undesired radiation noises emitted from the electronic element 53 can be easily inhibited by the heat conduction member 54.

Also, according to the present embodiment, the region provided with the low relative dielectric constant portion 55 in the lower surface 54a of the heat conduction member 54 is larger than the electronic element 53 and overlaps the entire electronic element 53 in a plan view seen in the vertical direction. Thus, the low relative dielectric constant portion 55 is positioned immediately above the entire electronic element 53, and the portion of the heat conduction member 54 connected to the electronic element 53 becomes the low relative dielectric constant portion 55. Therefore, the low relative dielectric constant portion 55 can more appropriately inhibit the undesired radiation noises from being coupled to the heat dissipation member 57 and can more appropriately reduce the undesired radiation noises emitted from the printed circuit board 51.

Also, according to the present embodiment, the heat conduction member 54 is a sheet-shaped heat conduction sheet. For this reason, the heat conduction member 54 can be easily attached to the upper surface of the electronic element 53 in accordance with the shape of the electronic element 53. In addition, the heat conduction member 54 can be easily attached to the lower surface of the heat dissipation member 57 in accordance with the shape of the heat dissipation member 57. As a result, the electronic element 53 and the heat dissipation member 57 can be brought into close contact with each other via the heat conduction member 54, and the heat dissipating properties of the electronic element 53 can be appropriately improved.

Second Embodiment

The present embodiment is different from the first embodiment in terms of the heat conduction member. Also, the same configurations as those of the above-described embodiment may be denoted by the same reference signs and the description may be omitted.

Figure 4:
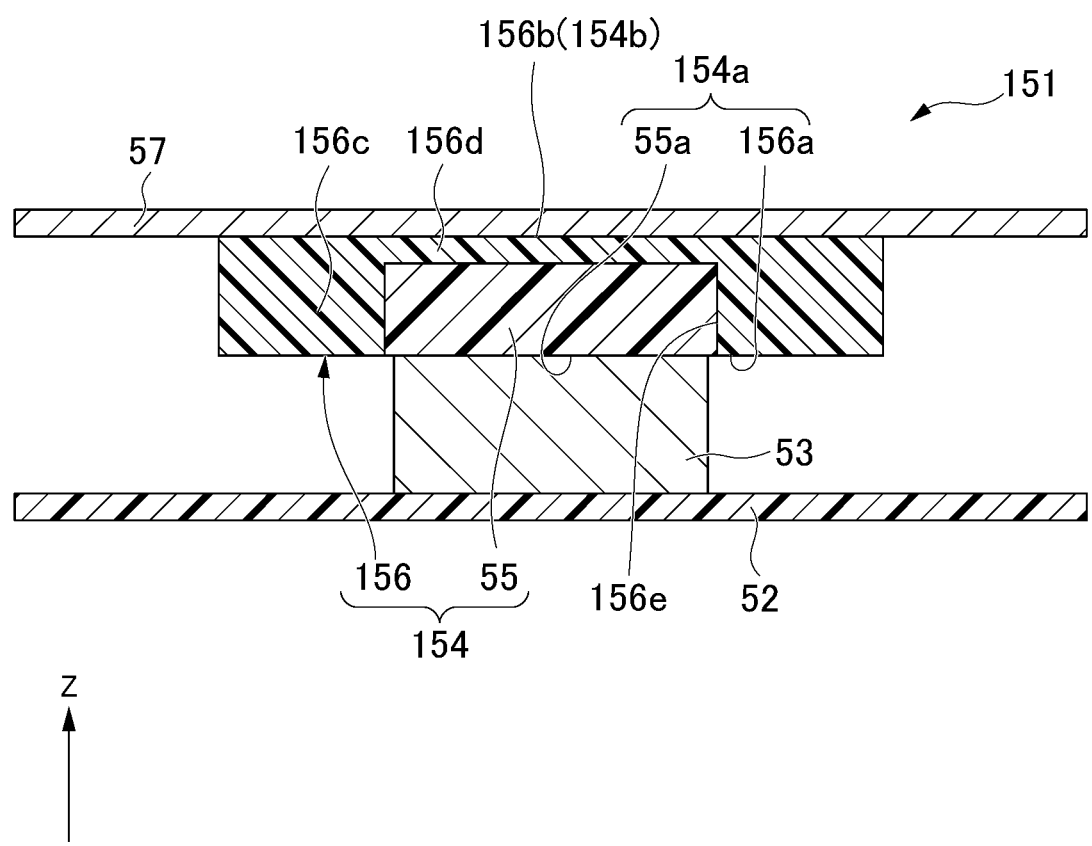
FIG. 4 is a cross-sectional view showing a printed circuit board according to a second embodiment.

FIG. 4 is a cross-sectional view showing a printed circuit board 151 of the present embodiment.

As shown in FIG. 4, the printed circuit board 151 of the present embodiment includes a printed wiring board 52, an electronic element 53, a heat dissipation member 57, and a heat conduction member (heat conduction sheet) 154.

The heat conduction member 154 has a low relative dielectric constant portion (a second portion) 55 and a high relative magnetic permeability portion (a first portion) 156.

A recessed portion 156e that is recessed upward is formed at a central portion of a lower surface 156a of the high relative magnetic permeability portion 156. Although not shown in the drawings, the recessed portion 156e has a square shape in a plan view seen in the vertical direction. The low relative dielectric constant portion 55 is fitted into the recessed portion 156e. An outer edge of the low relative dielectric constant portion 55 is disposed in contact with an inner edge of the recessed portion 156e. The low relative dielectric constant portion 55 and the high relative magnetic permeability portion 156 may be joined, for example, by an adhesive or the like. By forming the recessed portion 156e, a frame portion 156c surrounding the low relative dielectric constant portion 55 and an intervening portion 156d positioned between the low relative dielectric constant portion 55 and the heat dissipation member 57 in the vertical direction are formed in the high relative magnetic permeability portion 156.

The frame portion 156c has the same shape as the high relative magnetic permeability portion 56 of the first embodiment.

The intervening portion 156d is a bottom portion of the recessed portion 156e. A lower surface of the intervening portion 156d is in contact with an upper surface of the low relative dielectric constant portion 55. An upper surface of the intervening portion 156d is bonded to a lower surface of the heat dissipation member 57. The intervening portion 156d has a plate shape which extends in the horizontal direction.

In the present embodiment, the high relative magnetic permeability portion 156 surrounds the low relative dielectric constant portion 55 over a whole circumference thereof in a lower surface (second surface) 154a of the heat conduction member 154. The lower surface 154a of the heat conduction member 154 is configured of a lower surface 55a of the low relative dielectric constant portion 55 and a lower surface 156a of the high relative magnetic permeability portion 156. A distribution of the low relative dielectric constant portion 55 and the high relative magnetic permeability portion 156 in the lower surface 154a of the heat conduction member 154 is the same as that of the low relative dielectric constant portion 55 and the high relative magnetic permeability portion 56 in the lower surface 54a of the heat conduction member 54 of the first embodiment. On the other hand, in the present embodiment, an upper surface (a first surface) 154b of the heat conduction member 154 is configured by only the upper surface 156b of the high relative magnetic permeability portion 156. In the present embodiment, a dimension of the high relative magnetic permeability portion 156 in the vertical direction is larger than a dimension of the low relative dielectric constant portion 55 in the vertical direction.

In the present embodiment, a thermal conductivity of the high relative magnetic permeability portion 156 is large enough to appropriately transfer heat from the electronic element 53 to the heat dissipation member 57, and is, for example, about 0.5 or more and 20.0 or less. In the present embodiment, the heat of the electronic element 53 is transferred to the heat dissipation member 57 through the low relative dielectric constant portion 55 and the high relative magnetic permeability portion 156.

The other configuration of the high relative magnetic permeability portion 156 is the same as the other configuration of the high relative magnetic permeability portion 56 of the first embodiment. The other configuration of the printed circuit board 151 is the same as the other configuration of the printed circuit board 51 of the first embodiment.

According to the present embodiment, the high relative magnetic permeability portion 156 includes the intervening portion 156d as a portion positioned between the low relative dielectric constant portion 55 and the heat dissipation member 57 in the vertical direction. For this reason, when the undesired radiation noises that pass through the low relative dielectric constant portion 55 in the vertical direction from the electronic element 53 and are coupled to the heat dissipation member 57 are generated, the undesired radiation noises pass through the intervening portion 156d. Thus, the energy of undesired radiation noises coupled to the heat dissipation member 57 through the low relative dielectric constant portion 55 and the intervening portion 156d can be reduced due to a magnetic loss in the intervening portion 156d. Therefore, the energy of the undesired radiation noises emitted from the electronic element 53 can be further reduced, and the undesired radiation noises emitted from the printed circuit board 151 can be more appropriately reduced.

In each embodiment mentioned above, the following configurations can also be adopted.

The relative dielectric constant ε of the low relative dielectric constant portion (second portion) may be smaller than the relative dielectric constant ε of the high relative magnetic permeability portion (first portion) or equal to or smaller than 8.0. That is, the relative dielectric constant ε of the low relative dielectric constant portion may be larger than 8.0 as long as it is smaller than the relative dielectric constant ε of the high relative magnetic permeability portion. Further, the relative dielectric constant ε of the low relative dielectric constant portion may be equal to or larger than the relative dielectric constant ε of the high relative magnetic permeability portion as long as it is equal to or smaller than 8.0. Materials of the low relative dielectric constant portion is not particularly limited as long as the material satisfies relationships of the relative dielectric constant ε described above and has thermal conductivity. The low relative dielectric constant portion may include a magnetic body. The relative magnetic permeability μ of the low relative dielectric constant portion is not particularly limited.

The low relative dielectric constant portion may at least partially overlap the electronic element in a plan view seen in the vertical direction. The low relative dielectric constant portion may entirely overlap the electronic element in a plan view seen in the vertical direction. The region provided with the low relative dielectric constant portion in the lower surface of the heat conduction member may be the same size as the electronic element or smaller than the electronic element.

The shape of the high relative magnetic permeability portion is not particularly limited as long as it surrounds the low relative dielectric constant portion at least on the lower surface of the heat conduction member. The high relative magnetic permeability portion may at least partially overlap the electronic element in a plan view seen in the vertical direction. The material of the high relative magnetic permeability portion is not particularly limited as long as it contains a magnetic body.

The heat conduction member may have a portion other than the low relative dielectric constant portion and the high relative magnetic permeability portion. The heat conduction member may have, for example, a portion having a property different from any one of the low relative dielectric constant portion and the high relative magnetic permeability portion, between the low relative dielectric constant portion and the high relative magnetic permeability portion. The heat conduction member may be smaller than the electronic element in a plan view seen in the vertical direction, or may overlap only a portion of the electronic element in a plan view seen in the vertical direction. The heat conduction member may not have a sheet shape.

The electronic element is not particularly limited as long as it is an element provided on the mounting surface of the printed wiring board. The electronic element may be, for example, a transistor such as a field effect transistor (FET). The heat dissipation member is not particularly limited as long as it is thermally connected to the electronic element and can dissipate heat from the electronic element. The heat dissipation member may be, for example, a heat sink provided with fins for heat dissipation.

Also, in the first embodiment described above, an example in which the invention is applied to a transmissive type projector has been described, but the invention can also be applied to a reflective type projector. Here, the "transmissive type" indicates that a liquid crystal light valve including a liquid crystal panel or the like is a type that transmits light. The "reflective type" indicates that the liquid crystal light valve is a type that reflects light. In addition, the light modulation device is not limited to a liquid crystal panel or the like, and may be, for example, a light modulation device using a micro mirror.

Also, in the first embodiment described above, an example of the projector 1 using the three light modulation devices 4R, 4G and 4B has been described, but the invention is also applicable to a projector using only one light modulation device and a projector using four or more light modulation devices.

In addition, the electronic device on which the printed circuit board is mounted is not limited to the projector, and may be another electronic device.

Further, each structure described in the present specification can be appropriately combined in a range in which they do not contradict mutually.

EXAMPLES

Usefulness of the invention was confirmed by comparing an example and comparative examples 1 and 2. The example was a printed circuit board provided with a heat conduction member similar to the first embodiment described above. The material of the low relative dielectric constant portion in the example was acrylic resin, and the relative dielectric constant ε of the low relative dielectric constant portion in the example was 6.1. The low relative dielectric constant portion in the example is a nonmagnetic portion containing no magnetic body. That is, the relative magnetic permeability μ of the low relative dielectric constant portion in the example is approximately 1.0. The high relative magnetic permeability portion in the example had a configuration in which ferrite was mixed with an acrylic resin as a base material. The relative magnetic permeability μ of the high relative magnetic permeability portion in the example was 13.0. The relative dielectric constant ε of the high relative magnetic permeability portion in the example was 10.8. In the heat conduction member of the example, the thickness of the low relative dielectric constant portion and the thickness of the high relative magnetic permeability portion were the same as each other, and were 3.5 mm. In addition, when the heat conduction member is incorporated into the printed circuit board, the heat conduction member is pressed and crushed by the heat dissipation member and the electronic element, and the thickness of the low relative dielectric constant portion and the thickness of the high relative magnetic permeability portion are approximately 3.0 mm.

The comparative examples 1 and 2 were printed circuit boards provided with a heat conduction member having uniform properties throughout the member. External shapes and dimensions of the heat conduction member in the comparative examples 1 and 2 were the same as the external shape and dimension of the heat conduction member in the example. The comparative example 1 had a heat conduction member the entire of which has the same material and physical properties as the low relative dielectric constant portion of the example. The comparative example 2 has a heat conduction member the entire of which has the same material and physical properties as in the high relative magnetic permeability portion of the example.

In each of the example and the comparative examples 1 and 2, the printed wiring board was a multilayer printed wiring board, and the electronic element was an LSI. The heat dissipation member was a heat dissipating plate made of aluminum.

In each of the example and the comparative examples 1 and 2, the LSI was operated to measure the undesired radiation noises having the respective frequencies of 800 MHz, 1600 MHz and 2400 MHz. The measurement of the undesired radiation noises was performed for each of the horizontally polarized waves and the vertically polarized waves for each frequency.

Figure 5:
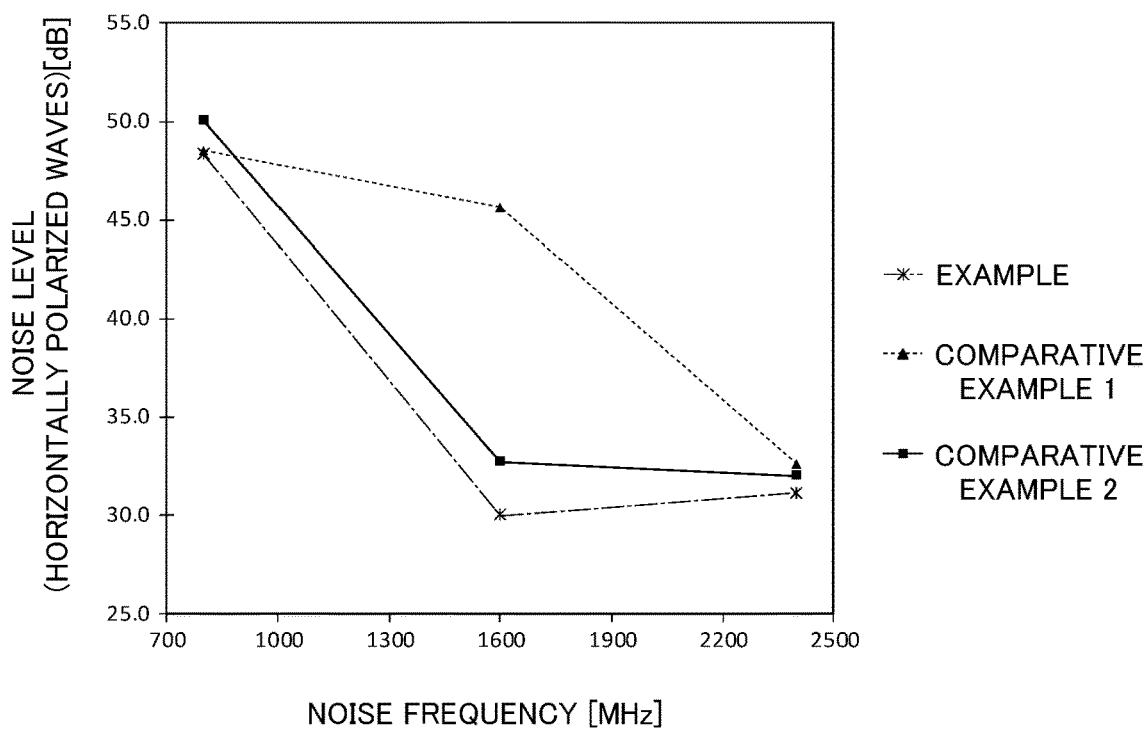
FIG. 5 is a graph showing measurement results of horizontally polarized waves among undesired radiation noises in an example and comparative examples 1 and 2.
Figure 6:
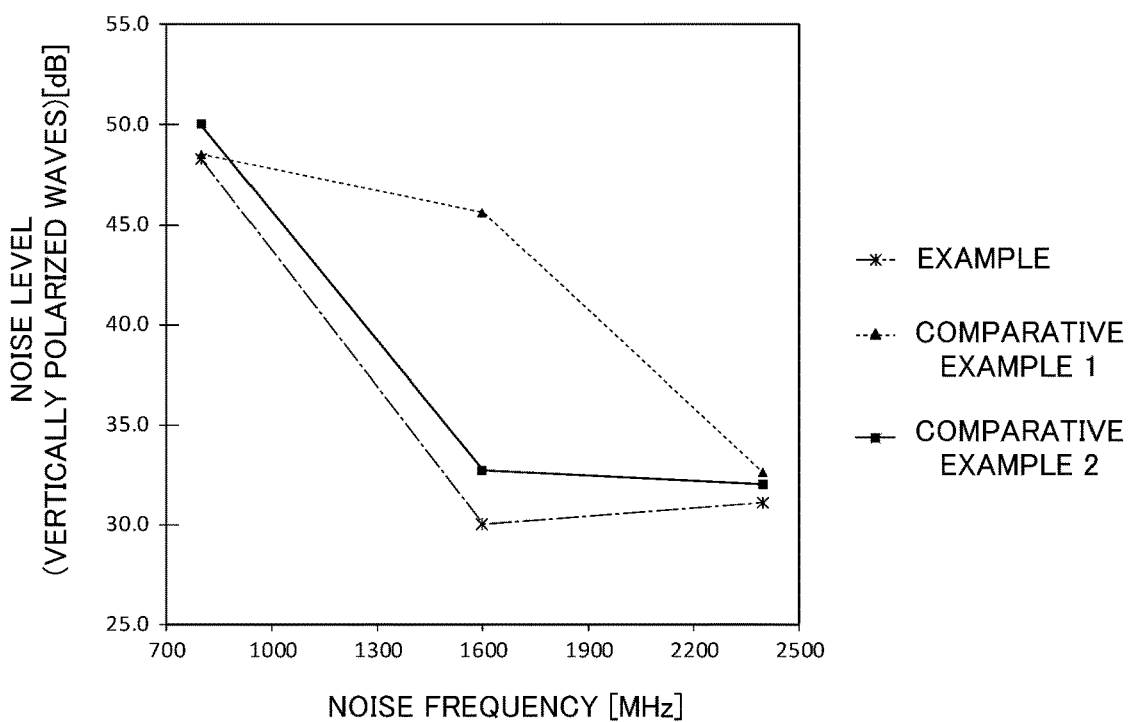
FIG. 6 is a graph showing measurement results of vertically polarized waves among undesired radiation noises in the example and the comparative examples 1 and 2.

The measurement of the undesired radiation noises was performed in an anechoic chamber equipped with an electric field strength measurement system based on the international standard set by the International Special Committee on Radio Interference (CISPR). The measurement results are shown in FIGS. 5 and 6. FIG. 5 is a graph showing the measurement results of horizontally polarized waves in the undesired radiation noises. FIG. 6 is a graph showing the measurement results of vertically polarized waves in the undesired radiation noises. In FIGS. 5 and 6, the horizontal axis is a noise frequency [MHz] of the undesired radiation noises, and the vertical axis is a noise level [dB] of the undesired radiation noises.

As shown in FIGS. 5 and 6, it was confirmed that the noise level in the example is smaller than the noise levels in the comparative examples 1 and 2 at 800 MHz, 1600 MHz and 2400 MHz in the horizontally polarized waves and the vertically polarized waves.

Also, it was confirmed that the noise level can be made smaller in the comparative example 1 than in the comparative example 2 at 800 MHz, while the noise level can be made smaller in the comparative example 2 than in the comparative example 1 at 1600 MHz and 2400 MHz. As a result, it was confirmed that reducing the relative dielectric constant ε is useful to inhibit the undesired radiation noises having a frequency lower than 1 GHz, while the contribution of including a magnetic body to make the relative magnetic permeability μ greater than 1.0 is relatively small to the inhibition of the undesired radiation noises having a frequency lower than 1 GHz. Also, it was confirmed that including a magnetic body to make the relative magnetic permeability μ larger than 1.0 is useful to inhibit the undesired radiation noises having a frequency of 1 GHz or more, while the contribution of reducing the relative dielectric constant ε is relatively small to the inhibition of the undesired radiation noises having a frequency of 1 GHz or more. Therefore, it was confirmed that reducing the relative dielectric constant and increasing the relative magnetic permeability μ are insufficient for the inhibition of the undesired radiation noises when only one of them is used.

From the above, the usefulness of the example having both the low relative dielectric constant portion and the high relative magnetic permeability portion was confirmed.

Next, using the plurality of samples having different relative dielectric constants c as heat conduction members, the same measurements as in the above-described example and comparative examples 1 and 2 were performed. Eight samples SA to SH were prepared. Each of the samples SA to SH was a heat conduction member having uniform properties throughout the member. The base material of the samples SA and SE was acrylic resin. Samples SB, SC, SD, SF, SG, and SH were configured of ferrite mixed with acrylic resin as a base material.

The relative dielectric constant $\varepsilon$ of the sample SA was 2.1. The relative dielectric constant $\varepsilon$ of the sample SB was 4.8. The relative dielectric constant $\varepsilon$ of the sample SC was 5.4. The relative dielectric constant $\varepsilon$ of the sample SD was 5.9. The relative dielectric constant $\varepsilon$ of the sample SE was 6.1. The relative dielectric constant of the sample SF was 6.4. The relative dielectric constant $\varepsilon$ of the sample SG was 8.0. The relative dielectric constant $\varepsilon$ of the sample SH was 10.8. The samples SA and SE were nonmagnetic, and the relative magnetic permeability $\mu$ was approximately 1.0. The relative magnetic permeability $\mu$ of the samples SB and SC was 2.3. The relative magnetic permeability $\mu$ of the sample SD was 2.4. The relative magnetic permeability 11 of the sample SF was 2.8. The relative magnetic permeability $\mu$ of the sample SG was 15.0. The relative magnetic permeability $\mu$ of the sample SH was 4.9.

The configuration other than the heat conduction member of the printed circuit board on which each of the samples SA to SH is provided is the same as that of the example and the comparative examples 1 and 2 described above.

Figure 7:
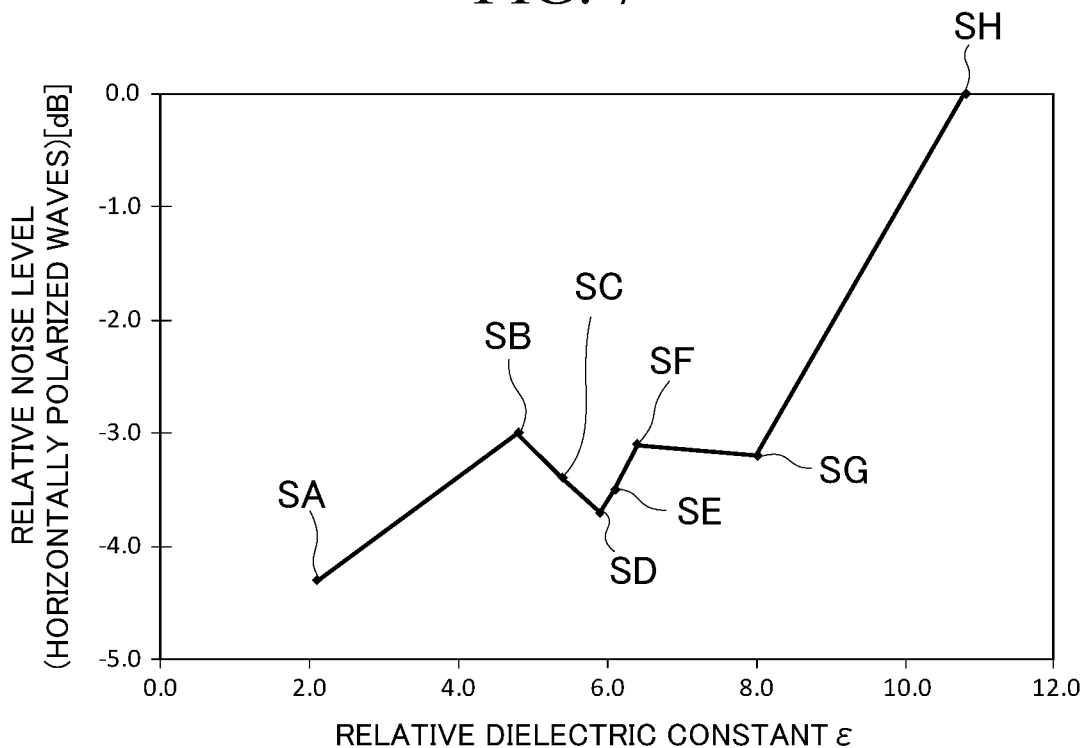
FIG. 7 is a graph showing measurement results of horizontally polarized waves among undesired radiation noises in each sample.
Figure 8:
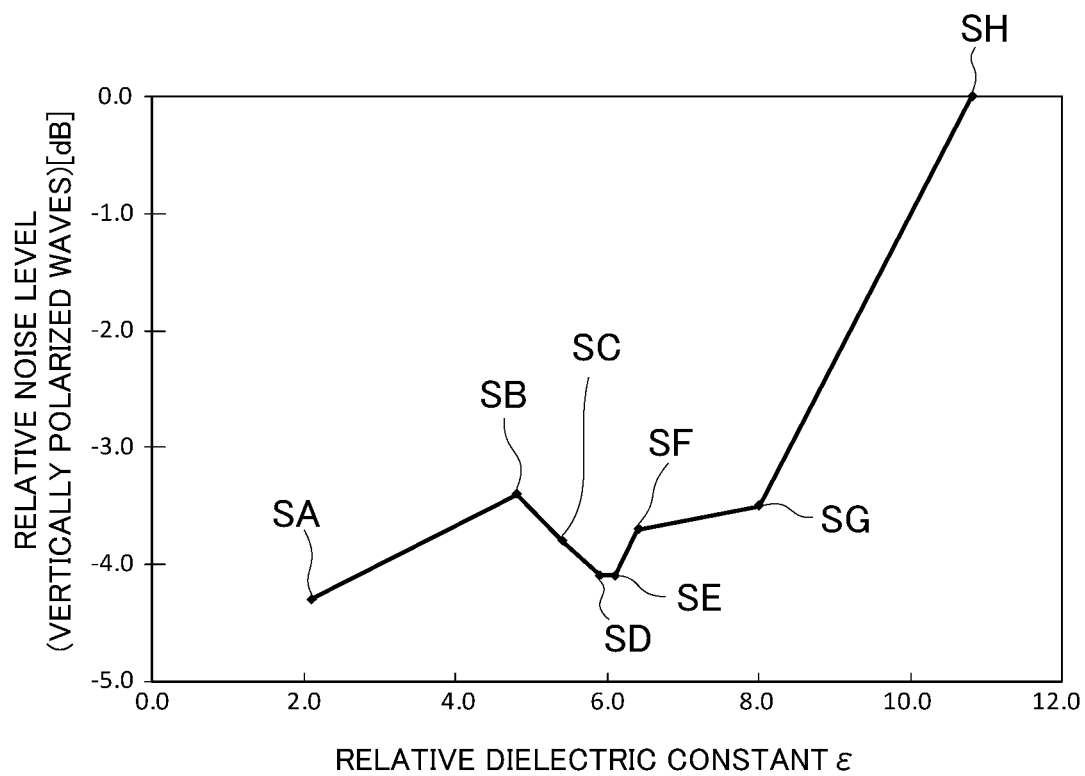
FIG. 8 is a graph showing measurement results of vertically polarized waves among undesired radiation noises in each sample.

The measurement was performed for each of the samples SA to SH in the same measurement environment as the measurement of the undesired radiation noises described above for each of the horizontally polarized waves and the vertically polarized waves in the undesired radiation noises at 800 MHz. The measurement results are shown in FIGS. 7 and 8. FIG. 7 is a graph showing the measurement results of horizontally polarized waves in the undesired radiation noises. FIG. 8 is a graph showing the measurement results of vertically polarized waves in the undesired radiation noises. In FIGS. 7 and 8, the horizontal axis is relative dielectric constant £, and the vertical axis is relative noise level [dB] of the undesired radiation noises. The relative noise level [dB] is a relative noise level with reference to the noise level of the sample SH.

As shown in FIGS. 7 and 8, it was confirmed that, in the samples SA to SG in which the relative dielectric constant $\varepsilon$ is 8.0 or less, the noise level can be largely reduced as compared with the sample SH in which the relative dielectric constant $\varepsilon$ is larger than 8.0. The noise level in the samples SA to SG is 3.0 dB or more smaller than the noise level of the sample SH. In view of the fact that the width of the distribution range of the noise level in the samples SA to SG in which the relative dielectric constant is in the range of 2.1 to 8.0 is approximately 1.0 dB, it can be said that the noise level reduction effect is remarkably large in that the noise level is reduced by 3.0 dB or more when the relative dielectric constant $\varepsilon$ becomes from 10.8 to 8.0.

Also, in the "Technical Conditions of Radio Frequency Interference Wave and Immunity Measurement Equipment Part 1-Volume 1: Radio Frequency Interference Wave and Immunity Measurement Equipment-Measurement Receiver-" included in the "On all standards of International Special Committee on Radio Interference (CISPR)" in the standards of International Special Committee on Radio Interference (CISPR), the antenna used for radiation interference wave measurements is defined to have a measurement accuracy better than ±3 dB. For this reason, the fact that the noise level can be reduced by 3.0 dB or more means that the noise level can be reduced beyond the tolerance of the measurement error, and an effective noise level reduction effect can be obtained.

From the above, it was confirmed that the noise inhibition effect can be more appropriately obtained by setting the relative dielectric constant $\varepsilon$ to be 8.0 or less.

Also, as described above, with respect to the inhibition of the undesired radiation noises lower than 1 GHz, increasing the relative magnetic permeability $\mu$ has a relatively small contribution. In addition, the frequency of the undesired radiation noises measured in the above samples SA to SH is 800 MHz. For this reason, in the above comparison of the samples SA to SH, if the relative magnetic permeability $\mu$ of the samples SA to SH is within the numerical range, the influence of the difference in relative magnetic permeability $\mu$ of the samples SA to SH is sufficiently negligible. That is, even if the relative magnetic permeability $\mu$ is made to be the same value without changing the relative dielectric constant $\varepsilon$ of the samples SA to SH, it is possible to obtain a result showing the same tendency as the above-mentioned result.

While preferred embodiments and modified example of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description, and is only limited by the scope of the appended claims.

What is claimed is:

1. A printed circuit board comprising:
   a printed wiring board having a mounting surface facing a first side;
   an electronic element provided on the mounting surface;
   a heat dissipation member which is disposed on the first side with respect to the electronic element and is thermally connected to the electronic element; and
   a heat conduction member disposed between the electronic element and the heat dissipation member, the heat conduction member having a first surface facing the first side and a second surface facing a second side opposite to the first side,
   wherein the heat conduction member has
      a high relative magnetic permeability portion including a magnetic body and
      a low relative dielectric constant portion having a relative dielectric constant smaller than a relative dielectric constant of the high relative magnetic permeability portion,
   the high relative magnetic permeability portion surrounds the low relative dielectric constant portion on at least the second surface of the heat conduction member, and
   at least part of the low relative dielectric constant portion overlaps the electronic element in a plan view seen in a predetermined direction perpendicular to the mounting surface.

2. The printed circuit board according to claim 1, wherein a relative dielectric constant of the low relative dielectric constant portion is equal to or less than 8.0.

3. The printed circuit board according to claim 1, wherein the high relative magnetic permeability portion has a frame shape surrounding the low relative dielectric constant portion, and surrounds the low relative dielectric constant portion on both the first surface of the heat conduction member and the second surface of the heat conduction member.

4. The printed circuit board according to claim 1, wherein the high relative magnetic permeability portion has a portion positioned between the low relative dielectric constant portion and the heat dissipation member in the predetermined direction.

5. The printed circuit board according to claim 1, wherein, in the plan view seen in the predetermined direction, the heat conduction member is larger than the electronic element and overlaps the entire electronic element.

6. The printed circuit board according to claim 5, wherein, in the plan view seen in the predetermined direction, a region where the low relative dielectric constant portion is provided on the second surface of the heat conduction member is larger than the electronic element and overlaps the entire electronic element.

7. The printed circuit board according to claim 1, wherein the heat conduction member has a sheet shape.

8. An electronic device comprising the printed circuit board according to claim 1.

9. A printed circuit board comprising:
a printed wiring board having a mounting surface facing a first side;
an electronic element provided on the mounting surface;
a heat dissipation member which is disposed on the first side with respect to the electronic element and is thermally connected to the electronic element; and
a heat conduction member disposed between the electronic element and the heat dissipation member, the heat conduction member having a first surface facing the first side and a second surface facing a second side opposite to the first side,
wherein the heat conduction member has
a high relative magnetic permeability portion including a magnetic body and
a low relative dielectric constant portion having a relative dielectric constant equal to or less than 8.0,
the high relative magnetic permeability portion surrounds the low relative dielectric constant portion on at least the second surface of the heat conduction member, and
at least part of the low relative dielectric constant portion overlaps the electronic element in a plan view seen in a predetermined direction perpendicular to the mounting surface.

10. The printed circuit board according to claim 9, wherein the high relative magnetic permeability portion has a frame shape surrounding the low relative dielectric constant portion, and surrounds the low relative dielectric constant portion on both the first surface of the heat conduction member and the second surface of the heat conduction member.

11. The printed circuit board according to claim 9, wherein the high relative magnetic permeability portion has a portion positioned between the low relative dielectric constant portion and the heat dissipation member in the predetermined direction.

12. The printed circuit board according to claim 9, wherein, in the plan view seen in the predetermined direction, the heat conduction member is larger than the electronic element and overlaps the entire electronic element.

13. The printed circuit board according to claim 12, wherein, in the plan view seen in the predetermined direction, a region where the low relative dielectric constant portion is provided on the second surface of the heat conduction member is larger than the electronic element and overlaps the entire electronic element.

14. The printed circuit board according to claim 9, wherein the heat conduction member has a sheet shape.

15. An electronic device comprising the printed circuit board according to claim 9.

16. A heat conduction sheet having a first surface and a second surface opposite to the first surface, comprising:
a high relative magnetic permeability portion including a magnetic body; and
a low relative dielectric constant portion having a relative dielectric constant smaller than a relative dielectric constant of the high relative magnetic permeability portion,
wherein the high relative magnetic permeability portion surrounds the low relative dielectric constant portion on at least the second surface of the heat conduction sheet.

17. The heat conduction sheet according to claim 16, wherein a relative dielectric constant of the low relative dielectric constant portion is equal to or less than 8.0.

18. A heat conduction sheet having a first surface and a second surface opposite to the first surface, comprising:
a high relative magnetic permeability portion including a magnetic body; and
a low relative dielectric constant portion having a relative dielectric constant equal to or less than 8.0,
wherein the high relative magnetic permeability portion surrounds the low relative dielectric constant portion on at least the second surface of the heat conduction sheet.

* * * * *